United States Patent
Ni et al.

(10) Patent No.: US 8,518,211 B2
(45) Date of Patent: Aug. 27, 2013

(54) SYSTEM AND METHOD FOR CONTROLLING PLASMA WITH AN ADJUSTABLE COUPLING TO GROUND CIRCUIT

(75) Inventors: Tuqiang Ni, Fremont, CA (US); Wenli Collison, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 478 days.

(21) Appl. No.: 11/282,106

(22) Filed: Nov. 16, 2005

(65) Prior Publication Data

US 2006/0112878 A1 Jun. 1, 2006

Related U.S. Application Data

(63) Continuation of application No. 10/326,918, filed on Dec. 20, 2002, now abandoned.

(51) Int. Cl.
*H01L 21/3065* (2006.01)
*C23C 16/00* (2006.01)

(52) U.S. Cl.
USPC ............ 156/345.44; 156/345.47; 118/723 E

(58) Field of Classification Search
USPC ........... 315/111.21; 118/723 E; 156/345.43, 156/345.44, 345.45, 345.46, 345.47
See application file for complete search history.

(56) References Cited

U.S. PATENT DOCUMENTS

| | | | |
|---|---|---|---|
| 4,464,223 A * | 8/1984 | Gorin | 438/729 |
| 5,006,192 A * | 4/1991 | Deguchi | 156/345.44 |
| 5,531,862 A * | 7/1996 | Otsubo et al. | 438/798 |
| 5,534,751 A | 7/1996 | Lenz et al. | |
| 5,698,062 A * | 12/1997 | Sakamoto et al. | 156/345.44 |
| 5,705,019 A | 1/1998 | Yamada et al. | |
| 5,998,932 A * | 12/1999 | Lenz | 315/111.21 |
| 6,008,130 A * | 12/1999 | Henderson et al. | 438/710 |
| 6,744,212 B2 * | 6/2004 | Fischer et al. | 315/111.21 |
| 2002/0185227 A1 | 12/2002 | MacGearailt | |

(Continued)

FOREIGN PATENT DOCUMENTS

| CN | 1515018 A | 7/2004 |
|---|---|---|
| CN | 1543662 A | 11/2004 |

(Continued)

OTHER PUBLICATIONS

"Notice of Office Action," mailed Jul. 11, 2007, for China Application No. 200380106131.8; Filed on Dec. 17, 2003; Inventors: Lam Research Corporation.

(Continued)

*Primary Examiner* — Sylvia R MacArthur
*Assistant Examiner* — Anna Crowell
(74) *Attorney, Agent, or Firm* — Klintworth & Rozenblat IP LLC

(57) ABSTRACT

A system and method for controlling plasma. The system includes a semiconductor chamber comprising a powered electrode, another electrode, and an adjustable coupling to ground circuit. The powered electrode is configured to receive a wafer or substrate. There is at least one grounded electrode configured to generate an electrical connection with the powered electrode. At least one of the grounded electrodes is electrically coupled to the adjustable coupling to ground circuit. The adjustable coupling to ground circuit is configured to modify the impedance of the grounded electrode. The ion energy of the plasma is controlled by the adjustable coupling to ground circuit.

16 Claims, 5 Drawing Sheets

(56) References Cited

U.S. PATENT DOCUMENTS

| | | | |
|---|---|---|---|
| 2003/0029567 A1* | 2/2003 | Dhindsa et al. | 156/345.47 |
| 2003/0037881 A1 | 2/2003 | Barnes et al. | |
| 2003/0205327 A1* | 11/2003 | Howald et al. | 156/345.28 |
| 2004/0118344 A1 | 6/2004 | Ni et al. | |

FOREIGN PATENT DOCUMENTS

| | | | |
|---|---|---|---|
| JP | 58-158929 | | 9/1983 |
| JP | 58158929 A | * | 9/1983 |
| JP | 358158929 A | | 9/1983 |
| JP | 61-166028 | | 7/1986 |
| JP | 61166028 A | * | 7/1986 |
| JP | 361166028 A | | 7/1986 |
| JP | 61-174633 | | 8/1986 |
| JP | 361176633 A | | 8/1986 |
| JP | 04-157164 | | 5/1992 |
| JP | 4157164 | | 5/1992 |
| JP | 04157164 A | * | 5/1992 |
| JP | 4157164 A | | 5/1992 |
| JP | 404157164 A | | 5/1992 |
| JP | 05234697 A | * | 9/1993 |
| JP | 8124862 A | | 5/1996 |
| JP | 08321488 A | * | 12/1996 |
| JP | 3022806 B2 | | 6/1997 |
| JP | 10-321598 | | 12/1998 |
| JP | 10321598 A | | 12/1998 |
| JP | 2004535039 T | | 11/2004 |
| JP | 2005500684 | | 1/2005 |
| TW | 550978 B | | 9/2003 |
| TW | 554437 B | | 9/2003 |
| WO | WO-2001-050498 | | 7/2001 |
| WO | WO-2002-027755 | | 4/2002 |
| WO | WO 0227755 A | * | 4/2002 |
| WO | 02101784 A1 | | 12/2002 |
| WO | WO03003405 A1 | * | 1/2003 |
| WO | WO 03003405 A1 | * | 1/2003 |
| WO | 03017318 A | | 2/2003 |
| WO | WO-03-017318 | | 2/2003 |

OTHER PUBLICATIONS

Supplementary European Search Report mailed Jun. 27, 2007, re 03814023.2 (based on PCT/US2003/39994).

Singapore Written Opinion mailed Nov. 23, 2007, re 200503963-1.

International Search Report mailed Jun. 7, 2004, PCT/US03/39994.

"Office Action", Issued in Taiwan Application No. 92136273; Mailing Date: Jun. 10, 2009.

"Office Action", Issued in Japanese Patent Application 2004-563-595, Mailing Date: Jul. 14, 2009.

"Office Action", Taiwan Application No. 92136273; Dec. 11, 2009.

"Austrian Patent Office Examination Report", Application No. 200503963-1, Mailing Date: Jun. 30, 2009.

"Notice of Preliminary Rejection", Korean Patent Application No. 2005-7011629, Mailing Date: Oct. 6, 2010.

"Substantive Examination Report", EP Patent Application No. 03 814 023.2-1226, Mailing Date: Jul. 5, 2009.

"Notification of Reason of Refusal", Japanese Patent Application; 2004-563-595, Mailing Date: Nov. 16, 2010.

* cited by examiner

SYSTEM AND METHOD FOR CONTROLLING PLASMA WITH AN ADJUSTABLE COUPLING TO GROUND CIRCUIT

RELATED APPLICATIONS

This application is a Continuation of prior application Ser. No. 10/326,918, filed Dec. 20, 2002, now abandoned (incorporated by reference herein), from which priority under 35 U.S.C. §120 is claimed.

BACKGROUND OF THE INVENTION

1. Field of Invention

The present invention is related to semiconductor fabrication. More particularly, the invention is related to plasma processing during semiconductor fabrication.

2. Description of Related Art

In the fabrication of semiconductor based devices (e.g. integrated circuits or flat panel displays) layers of material may alternately be deposited onto and etched from a wafer or substrate surface (e.g., the semiconductor wafer or the glass panel). As is well known in the art, the etching of the deposited layer(s) may be accomplished by a variety of techniques, including plasma-enhanced etching. In plasma-enhanced etching, the actual etching of the wafer or substrate takes place inside a plasma processing chamber. During the etching process, a plasma is formed from a suitable etchant source gas to etch areas of the wafer or substrate that are unprotected by a mask, leaving behind the desired pattern.

There are two types of plasmas that are employed in plasma-enhanced etching, namely, confined plasmas and unconfined plasmas. Unconfined plasmas touch the plasma processing chamber walls and may contaminate the wafer or substrate by re-depositing atoms from the chamber walls on to the wafer or substrate. Typically, the plasma processing chamber walls are made of materials that are incompatible to the wafer or substrate. With confined plasma, there is little or no contamination since the plasma is stopped by some means from reaching the chamber walls. Thus, confined plasmas provide a level of cleanliness that is not provided by well-known unconfined plasmas.

In prior art systems plasma can be prevented from reaching the chamber walls by establishing a variety of repulsive fields, either electric or magnetic in nature. By way of example, the plasma is confined by a plurality of confinement rings resident within the chamber walls and by means of draining charge out of the plasma just before it can reach the inner limits of the confinement rings. Since the confinement rings are made from an insulating material they will charge to a potential comparable to that of the plasma. Consequently, a repulsive electric field will emanate from the leading edge of each confinement ring that will keep plasma from protruding any further out toward the chamber walls.

Referring to FIG. 1 there is shown an illustrative prior art system 100 having a process chamber that generates a capacitively coupled RF plasma. By way of example and not of limitation, the illustrative system is an EXELAN system manufactured by Lam Research Corporation. The illustrative system 100 includes a parallel plate plasma reactor such as reactor 100. The reactor 100 includes a chamber having an interior 102 maintained at a desired vacuum pressure by a vacuum pump 104 connected to an outlet in a wall of the reactor. Etching gas can be supplied to the plasma reactor supplying gas from gas supply 106. For example, a medium density plasma can be generated in the reactor by a dual frequency arrangement wherein RF energy from RF source 108 is supplied through a matching network 110 to a powered electrode 112. The RF source 108 is configured to supply RF power at 27 MHz and 2 MHz. Electrode 114 is a grounded electrode. A wafer or substrate 116 is supported by the powered electrode 112 and is etched with plasma generated by energizing the etch gasses into a plasma state. A plurality of confinement rings 120a and 120b confine the plasma. Other capacitively coupled reactors can also be used such as reactors wherein RF power is supplied to both electrodes such as the dual frequency plasma etch reactor described in commonly owned U.S. Pat. No. 6,090,304, the disclosure of which is hereby incorporated by reference.

Referring to FIG. 2 there is shown a cross-sectional view of the interior 102 of the plasma processing chamber 100. The interior 102 includes confinement rings 120a and 120b. Although only two confinement rings are shown, any number of confinement rings may be provided. Within the interior 102 of plasma processing chamber 100, there is shown a powered electrode 122 on which is adapted to receive a wafer or substrate 124. The powered electrode 124 can be implemented with any suitable chucking system, e.g. electrostatic, mechanical, clamping, vacuum, or the like, and is surrounded by an insulator 126 such as a quartz focus ring. During etching, RF power supply 128 can communicate RE power having a frequency of about 2 MHz to about 27 MHz to powered electrode 122. Above wafer or substrate 124, there is disposed a grounded electrode 130, which is coupled to confinement rings 120a and 120b. Another grounded electrode 132 abuts the insulator ring 126 and is located near the powered electrode 122. In operation, RF power supply 128 communicates RF power to powered electrode 122 that is electrically coupled to grounded electrode 130.

SUMMARY OF INVENTION

The invention provides a system and a method of controlling the ion energy and plasma density within a chamber configured to generate a plasma. In the illustrative embodiment, the plasma is generated with a capacitively coupled discharge. The semiconductor chamber includes a powered electrode, a power supply, a plurality of grounded electrodes, and an adjustable coupling to ground circuit. The powered electrode is configured to receive a wafer or substrate. The power supply is operatively coupled to the powered electrode. The plurality of grounded electrodes are configured to generate an electrical connection with the powered electrode. At least one of the grounded electrodes is electrically coupled to the adjustable coupling to ground circuit. The adjustable coupling to ground circuit is configured to modify the impedance of the grounded electrode. The ion energy is controlled by the adjustable coupling to ground circuit. The plasma density is controlled by the power supply.

The adjustable coupling to ground circuit comprises either a capacitor or an inductor or a combination thereof. In one embodiment, the capacitor is a variable capacitor. In another embodiment the capacitor can have a fixed capacitance. A combination of fixed and variable capacitors and inductors can also be employed. In another embodiment an inductor, such as an inductor having variable inductance, is used instead of capacitor. In yet another embodiment, the combination of capacitor and inductor is used as the adjustable coupling to ground circuit.

In operation, the illustrative chamber is configured to generate a confined plasma that is confined with a plurality of confinement rings. In the illustrative embodiment there is a first grounded electrode electrically coupled to an adjustable coupling to ground circuit. The adjustable coupling to ground circuit provides the first grounded electrode with a first impedance. The first impedance for the first grounded electrode is dependent on the capacitors or inductors used in the adjustable coupling to ground circuit. A second grounded electrode and third grounded electrode is coupled directly to ground. In the illustrative embodiment, the first impedance for the first grounded electrode is greater than the impedance associated with the other electrodes. As a result of these changes in impedance in the grounded electrodes the ion energy for the plasma can be controlled. For the illustrative example, the first grounded electrode with the higher impedance shifts the ion energy away from the first grounded electrode to the other grounded electrodes.

Additionally, a method for controlling plasma in a plasma processing chamber is provided. The method comprises the first step of receiving a gas in the plasma processing chamber. The powered electrode is configured to receive a wafer or substrate and receives power from a power supply. The plasma is generated by electrically coupling the powered electrode to a first grounded electrode and a second grounded electrode. The impedance of the grounded electrodes is used to control the ion energy. The power supply is used to control the plasma density.

BRIEF DESCRIPTION OF THE DRAWINGS

Preferred embodiments of the present invention are shown in the accompanying drawings wherein.

DETAILED DESCRIPTION

In the following detailed description, reference is made to the accompanying drawings, which form a part of this application. The drawings show, by way of illustration, specific embodiments in which the invention may be practiced. It is to be understood that other embodiments may be utilized and structural changes may be made without departing from the scope of the present invention.

Figure 3:
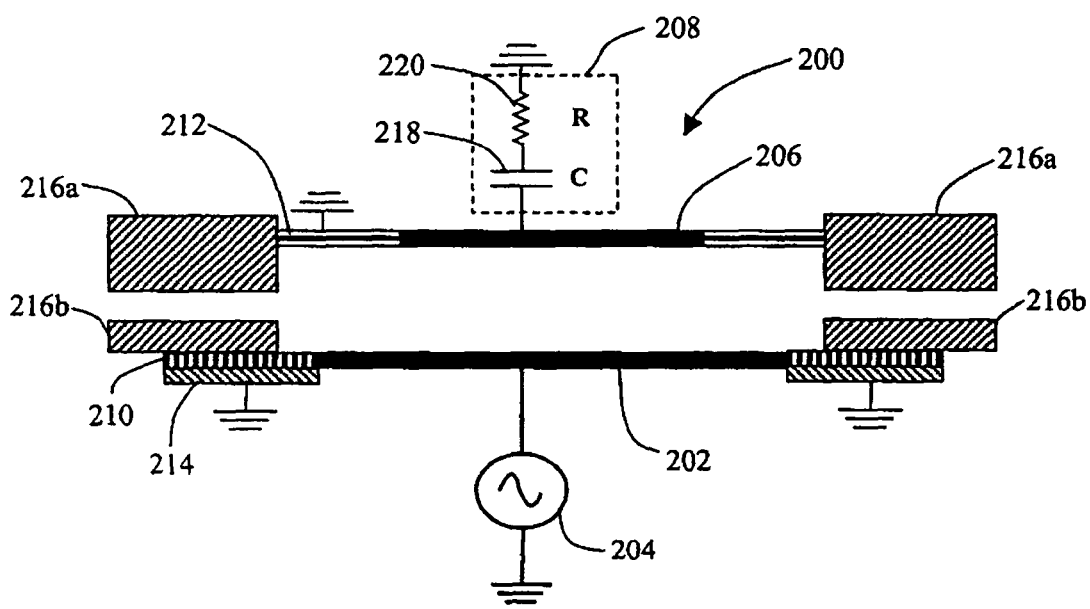
FIG. 3 is a cross-sectional view of a first embodiment of a plasma processing chamber having an adjustable coupling to ground circuit.

Referring to FIG. 3 there is shown a first embodiment of a plasma processing chamber having an adjustable coupling to ground circuit. FIG. 3 is a cross-sectional view of a processing chamber 200 configured to generate a capacitively coupled discharge. The plasma processing chamber 200 is also referred to as a system. In operation, the plasma processing chamber 200 is configured to receive a gas that is converted into a plasma. By way of example and not of limitation, a relatively high gas flow rate is pumped into the plasma processing chamber.

The plasma processing chamber 200 includes a powered electrode 202, a power supply 204, and a first grounded electrode 206 having an adjustable coupling to ground circuit 208. The powered electrode 202 is adapted to receive a wafer or substrate. The powered electrode 202 is operatively coupled to the power supply 204 configured to generate a RF power. By way of example and not of limitation, the first grounded electrode has an area that is less than the area of the powered electrode 202. Additionally, by way of example and not of limitation, the power supply 204 is a RF power source.

A quartz focus ring 210 surrounds the powered electrode 202. Additionally, a second grounded electrode ring 212 surrounds the first grounded electrode 206. The second grounded electrode ring 212 is electrically coupled to ground and does not have an adjustable coupling to ground circuit. A third grounded electrode 214 is disposed below the quartz focus ring 210. The third grounded electrode 214 also does not include an adjustable coupling to ground circuit.

The plasma processing chamber 200 is configured to generate a confined plasma. Confinement rings 216a and 216b are configured to confine the plasma. Typically, the plasma processing chamber walls are made of materials that are incompatible with the wafer or substrate. Confined plasma provides little or no contamination from the processing chamber walls. It shall be appreciated by those skilled in the art that confined plasmas provide a level of cleanliness that is not provided by well-known unconfined plasmas.

The adjustable coupling to ground circuit 208 is electrically coupled to the first grounded electrode 206. The adjustable coupling to ground circuit 208 is configured to modify the impedance of the first grounded electrode 206. The ion energy and plasma density of the confined plasma is controlled by the adjustable coupling to ground circuit 208. The adjustable coupling to ground circuit 208 comprises a capacitor 218. The capacitor 218 has a fixed capacitance which is typically less than 1000 pf. However, it shall be appreciated by those skilled in the art that the capacitor 218 can also be a variable capacitor.

The capacitor 218 and resistor 220 of the adjustable coupling to ground circuit 208 generates a first impedance which is different from the impedance of the second grounded electrode 212 and the third grounded electrode 214. As a result of these changes in impedance in the grounded electrodes, the ion energy and the plasma density for the plasma can be controlled. For the first embodiment, the first grounded electrode 206 with the adjustable coupling to ground circuit 208 has a higher impedance than both the second grounded electrode 212 and the third grounded electrode 214. The higher impedance from the first grounded electrode shifts the ion energy and plasma density away from the first grounded electrode so that the ion energy and plasma density is shifted to the grounded electrode having a lower impedance.

In the prior art, dual frequency RF power supplies, e.g. 27 MHz and 2 MHz, are used for the independent control of plasma density and ion energy. Here, the processing chamber 200 permits the independent control of plasma density and ion energy with one RF source. The adjustable coupling to ground circuit 208 in combination with the grounded electrodes permits the independent control of the ion energy with one RF source. The plasma density is mainly controlled by the total power supplied by the power supply 204.

Figure 1:
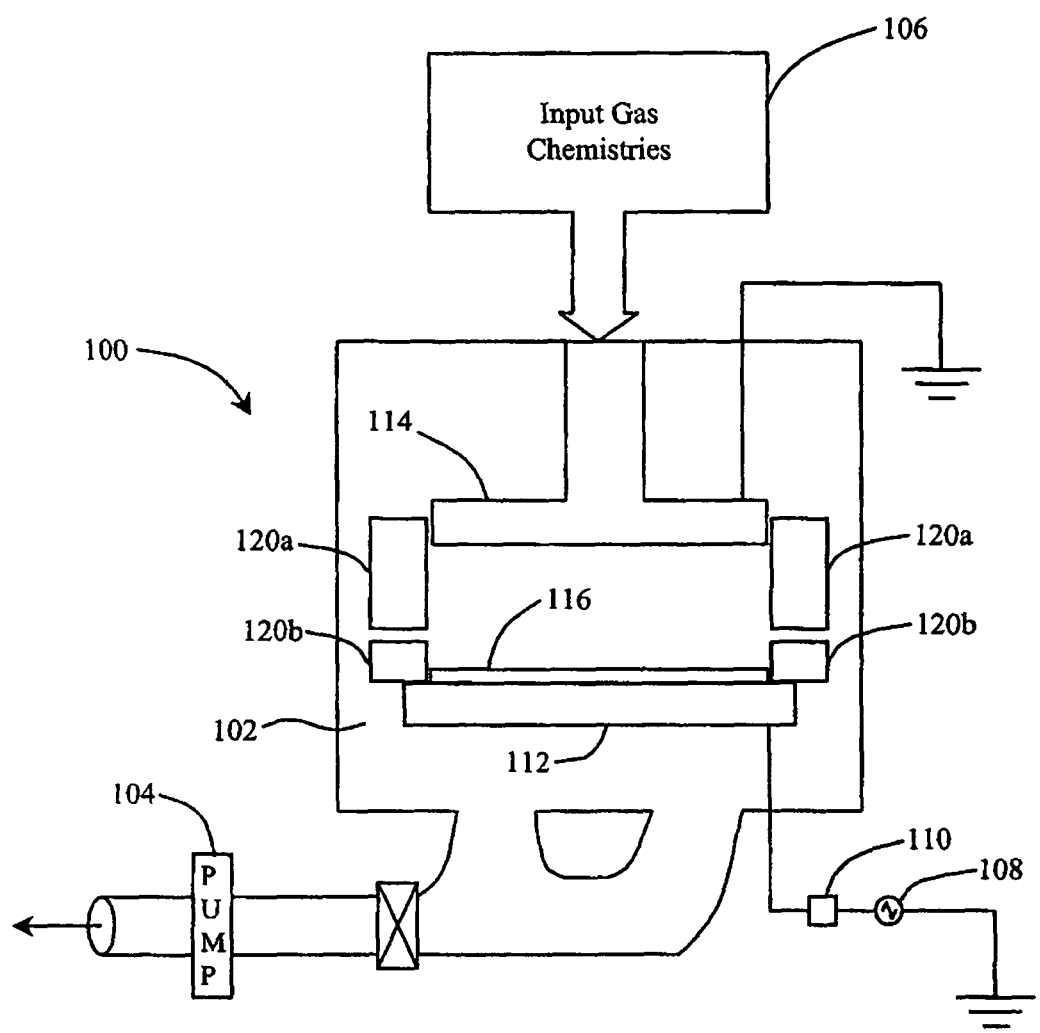
FIG. 1 is a prior art system having a process chamber that generates a capacitively coupled plasma.
Figure 2:
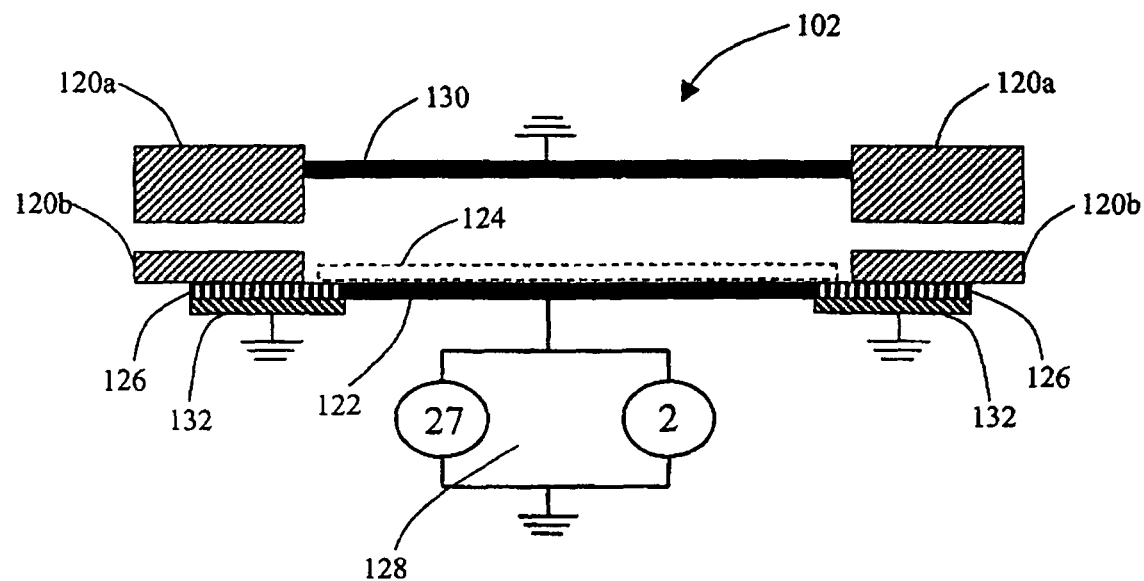
FIG. 2 is a cross-sectional view of the interior of the plasma processing chamber shown in FIG. 1.

An illustrative mathematical model has been used to confirm the ability to control ion energy and the plasma density. Referring back to the prior art processing chamber in FIG. 1 and FIG. 2, a 1200V (peak-to-peak) and 27 MHz RF power is applied to the bottom electrode 122, the resulting DC bias is approximately 302V and a plasma electrode voltage of −858V. Referring now to FIG. 3, an illustrative adjustable coupling to ground circuit comprises a capacitor 218 having a capacitance of 2 pF and a resistor 220 having a resistance of 3 μΩ. For the processing chamber 200, 1100V and 27 MHz RF power is applied to the powered electrode 202 to achieve a plasma density and plasma distribution similar to the plasma generated by the processing chamber 100. Additionally, due to the change in impedance at the first grounded electrode, the DC bias is only −200 V and the plasma electrode voltage is 659V. This illustrative example clearly shows that the plasma density and ion energy within the processing chamber 200 can be controlled by modifying the RF power and with the adjustable coupling to ground circuit.

Figure 4:
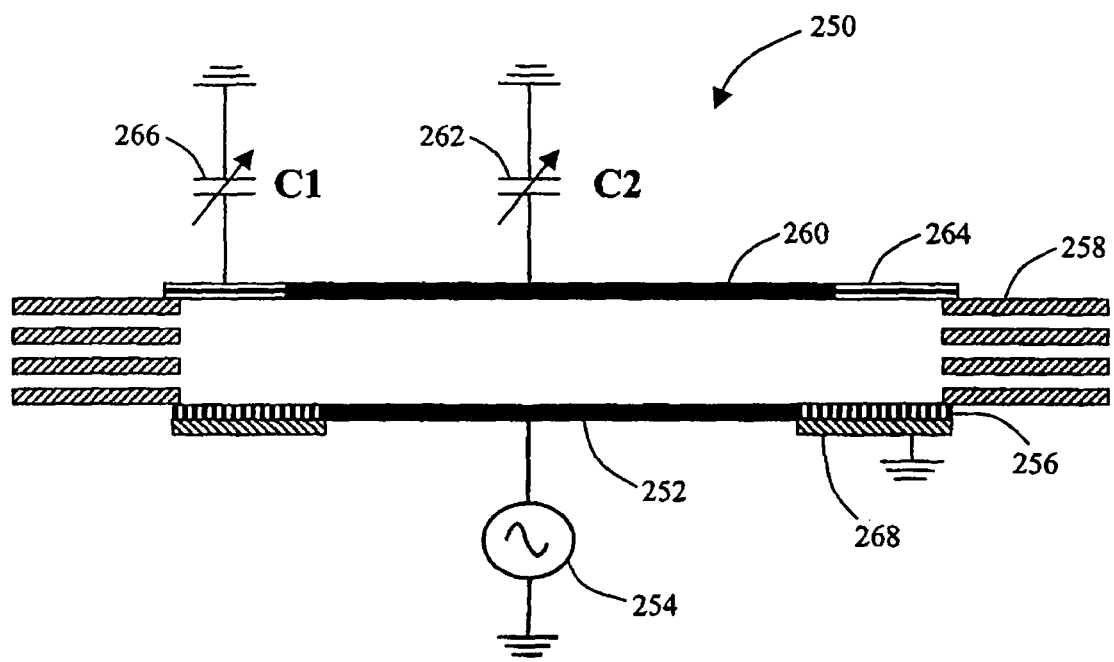
FIG. 4 is a cross-sectional view of a second embodiment of a plasma processing chamber with an adjustable coupling to ground circuit.

Referring to FIG. 4, there is shown another processing chamber 250 configured to control ion energy and plasma density. A powered electrode 252 is operatively coupled to a power supply 254. A quartz focus ring 256 surrounds the powered electrode 252. A plasma is formed within the processing chamber 250, and is confined by confinement rings 258. A first grounded electrode 260 has a surface area greater than the first powered electrode 252. The first grounded electrode 260 is electrically coupled to a variable capacitor 262 that permits the adjustable coupling to ground. By way of example and not of limitation, the variable capacitor 262 has a capacitance range of 5 pF to 1000 pF. A second grounded electrode 264 is a grounded ring that surrounds the first grounded electrode 260. The second grounded electrode 264 is operatively coupled to another variable capacitor 266. A third grounded electrode 268 is disposed beneath the quartz focus ring 256.

In operation the processing chamber 250, permits a higher degree of control of the ion energy than the processing chamber 200. The improved control is provided by having two adjustable coupling to ground circuits. The first grounded electrode 260 and the second grounded electrode 264 have the capacity to modify their respective impedance. As a result, an operator can more effectively control the "top" of a confined plasma.

Figure 5:
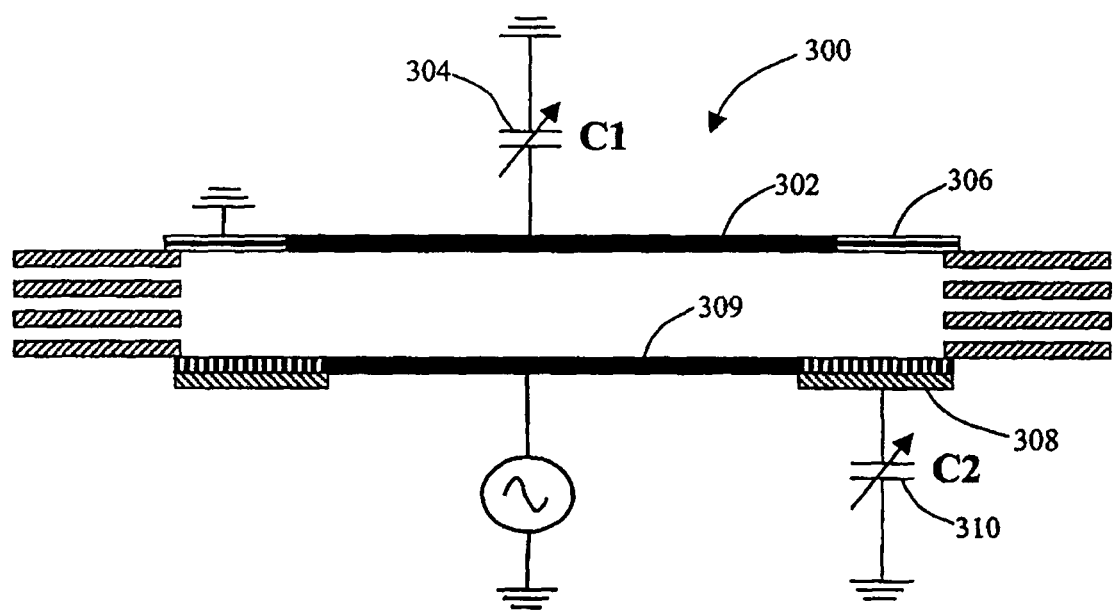
FIG. 5 is a cross-sectional view of a third embodiment of a plasma processing chamber with an adjustable coupling to ground circuit.

Referring to FIG. 5, there is shown yet another processing chamber 300 with an adjustable coupling to ground circuit. The processing chamber 300 shares much in common with processing chamber 250 of FIG. 4 such as confinement rings, a focus ring, a powered electrode and a power supply. The difference between processing chambers revolves around the grounded electrodes. Processing chamber 300 includes a first grounded electrode 302 operatively coupled to variable capacitor 304. A second grounded electrode 304 is a ring that surround the first grounded electrode 302. A third grounded electrode 308 is disposed adjacent the powered electrode 309. A variable capacitor 310 is electrically coupled to the third grounded electrode.

In operation, it is expected that the combination of grounded electrodes in processing chamber 300 permit an operator to control the ion energy on the top of a confined plasma and on the sides of the confined plasma. It shall be appreciated by those of ordinary skill in the art that the second ground electrode 306 can also be adapted to possess an adjustable coupling to ground circuit to control its respective impedance.

Figure 6:
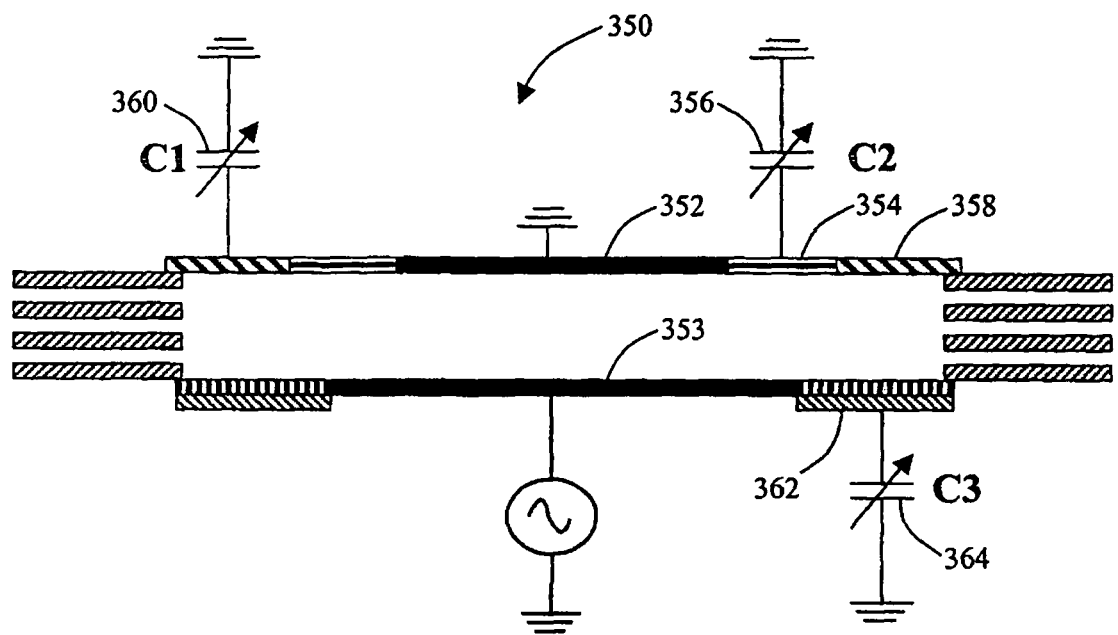
FIG. 6 is a cross-sectional view of a fourth embodiment of a plasma processing chamber with an adjustable coupling to ground circuit.

Referring to FIG. 6, there is shown a processing chamber 350 having four grounded electrodes. The first grounded electrode 352 is grounded and has an area smaller than the powered electrode 353. The second grounded electrode 354 is a ring that surrounds the first grounded electrode 352. The second grounded electrode 354 is electrically coupled to a variable capacitor 356 and has a variable impedance. The third grounded electrode 358 is another ring that surrounds the second grounded electrode 354. The third grounded electrode 358 is operatively coupled to a variable capacitor 360 and also has a variable impedance. A fourth grounded electrode 362 is located near the powered electrode 353 and is operatively coupled to a variable capacitor 364. In operation, this processing chamber 350 permits the operator to control the ion energy on the sides of a confined plasma.

Figure 7:
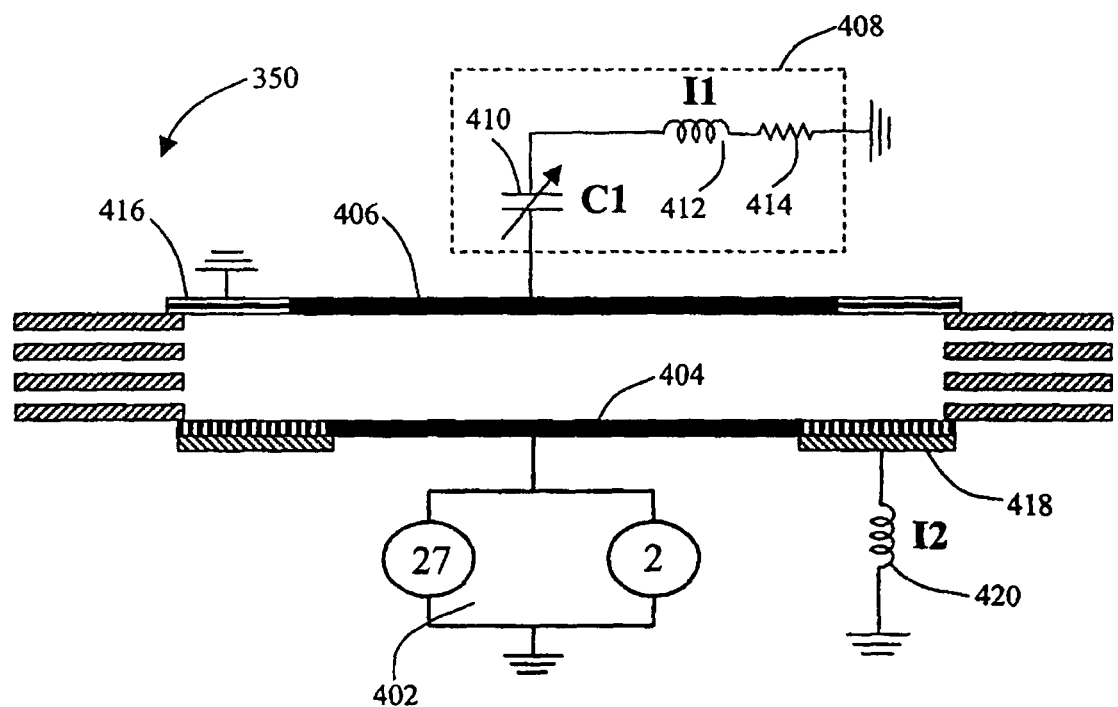
FIG. 7 is a cross-sectional view of a fifth embodiment of a plasma processing chamber with an adjustable coupling to ground circuit.

Referring to FIG. 7 there is shown a processing chamber 400 having a dual frequency power supply 402. By way of example and not of limitation, the dual frequency power supply generates RF power at 27 MHz and 2 MHz. A powered electrode 404 is operatively coupled to the dual frequency power supply 402. A first grounded electrode 406 is electrically coupled to an adjustable coupling to ground circuit 408. The adjustable coupling to ground circuit 408 includes a variable capacitor 410, and inductor 412, and a resistor 414. The adjustable coupling to ground circuit 408 is configured to act as a high pass filter or a low pass filter, in addition to permitting control of the impedance for the first grounded electrode 406. A second grounded electrode 416 surrounds the first grounded electrode 406. The second grounded electrode 416 does not include an adjustable coupling to ground circuit. A third grounded electrode 418 is adjacent to powered electrode 404. The third grounded electrode is electrically coupled to inductor 420.

In operation, the impedance of the third grounded electrode can be controlled by using an inductor 418 instead of a capacitor. It shall be appreciated by those of ordinary skill in the art that the inductor can also be a variable inductor configured to generate a variety of different inductances which are controlled by the tool operator.

Furthermore, the impedance of the first grounded electrode 410 can be controlled by the adjustable coupling to ground circuit's variable capacitor 410, inductor 412 and resistor 414. Additionally, the adjustable coupling to ground circuit 408 can be used to filter out either the 27 MHz RF power or the 2 MHz RF power of the dual frequency power supply 402.

Figure 8:
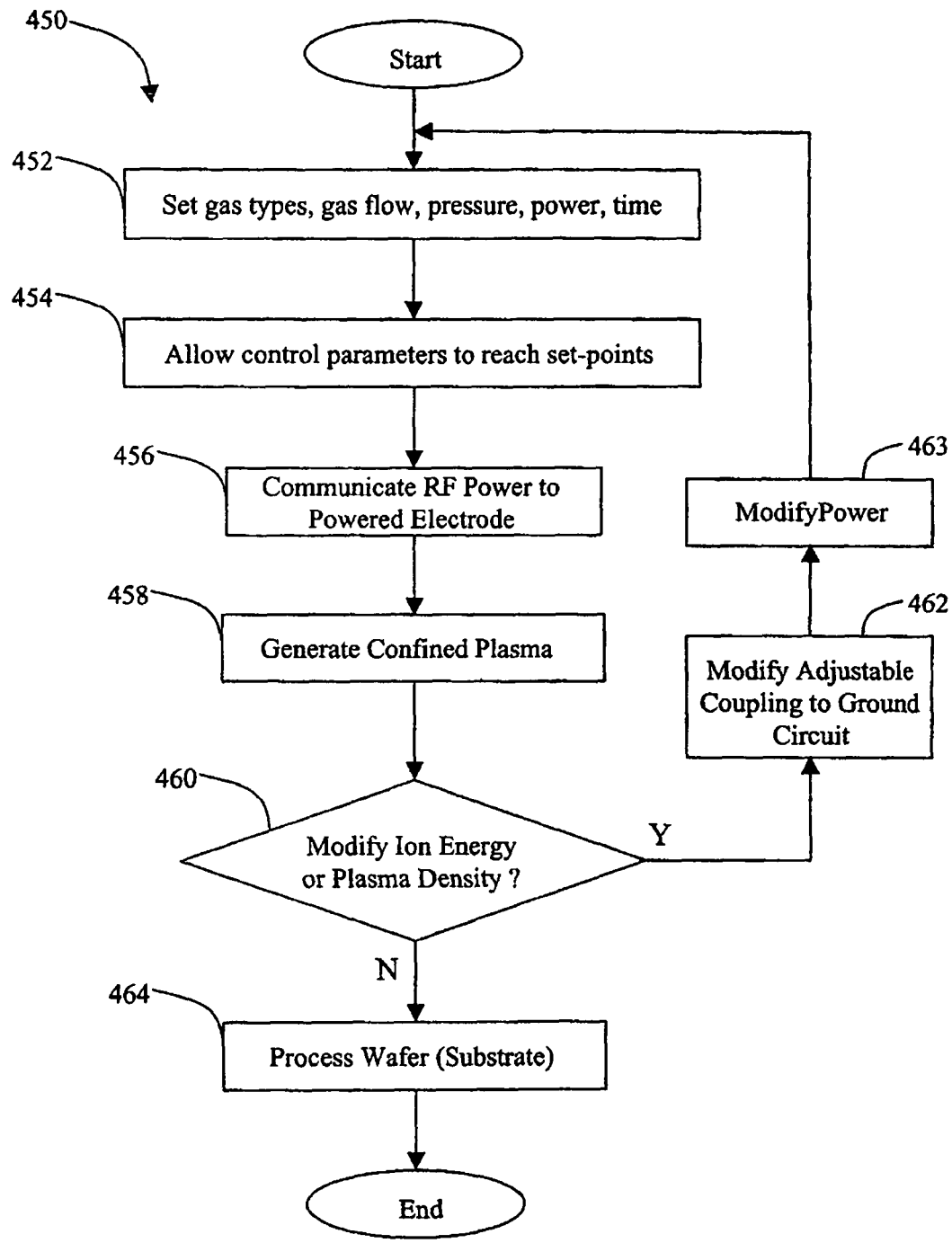
FIG. 8 is flowchart for a method of controlling plasma in a processing chamber.

Referring to FIG. 8 there is shown a flowchart of a method 450 for controlling plasma in a processing chamber by using the various systems described above. The method is initiated at process step 452 in which the operating parameters for plasma processing chamber are established. The operating parameters are specific to the type of task being performed. By way of example and not of limitation, for an etching process the type of gases are selected and the gas flow rates for each of the gases is determined. Then the operating pressure for the particular task is input into the tool. Additionally, the amount of RF power that is being applied is also provided. Further still, the time needed to perform the illustrative etching operation is also provided. Alternatively the systems described above can also be adapted to work with plasma-assisted chemical vapor deposition. The method then proceeds to process step 454 in which the illustrative control parameters identified in process block 152 reach steady state and the desired set-points are reached.

The method then proceeds to process block 456 in which RF power is communicated to a powered electrode. For illustrative purposes the systems above referred to a single powered electrode, however, it shall be appreciated by those skilled in the art having the benefit of this disclosure that the systems and methods described in this patent can be applied to processing chambers having a plurality of powered electrodes.

At process block 458 of the illustrative method, a confined plasma is then generated. Once the plasma is generated, a decision is made as to whether the ion energy and plasma density should be modified. This decision is made at decision diamond 460. If the determination is to modify the ion energy of the confined plasma, then the method proceeds to process block 462 where the adjustable coupling circuit is modified. If the plasma density is must be changed then the method proceeds to process block 463, and the power is modified to control the plasma density. The adjustable coupling circuit controls the ion energy by modifying the impedance of grounded electrodes. The plasma density is controlled by the power supply.

If the determination at decision diamond 460 is that the properties of the plasma are acceptable, the method then proceeds to process block 464 in which a substrate or wafer is processed. It shall be appreciated by those of ordinary skill in the art having the benefit of this disclosure that the adjustable coupling to ground circuit may be configured so that the illustrative confined plasma has the desired ion energy and plasma density.

Although the description above contains many different embodiments, these should not be construed as limiting the scope of the invention but as merely providing illustrations of some of the presently preferred embodiments of this invention. Thus, the scope of the invention should be determined by the appended claims and their legal equivalents rather than by the illustrative examples given.

What is claimed is:

1. A plasma processing chamber for generating plasma, the plasma processing chamber comprising:
    a powered electrode configured to receive a wafer or a substrate;
    a first grounded electrode disposed opposite to said powered electrode, wherein said plasma is configured to be generated between said powered electrode and said first grounded electrode;
    a second grounded electrode surrounding said first grounded electrode and disposed opposite to said powered electrode;
    a confinement ring for confining said plasma and surrounding said first and second grounded electrodes and is disposed opposite to said powered electrode, wherein said second grounded electrode is disposed between and surrounded by said confinement ring and said first grounded electrode;
    an adjustable coupling to ground circuit electrically coupled to said first grounded electrode, said first grounded electrode being electrically coupled to a ground through said adjustable coupling to ground circuit, said adjustable coupling to ground circuit configured to modify an impedance of said first grounded electrode, wherein said adjustable coupling to ground circuit comprises at least one capacitor and a resistor, said capacitor being electrically coupled to said ground through said resistor; and
    a second coupling to ground circuit electrically coupled to said second grounded electrode, said second grounded electrode being electrically coupled to said ground through said second coupling to ground circuit, said second coupling to ground circuit being external to said second grounded electrode, said second coupling to ground circuit being disposed between said confinement ring and said first grounded electrode;
    a focus ring, said focus ring surrounding said powered electrode; and
    a third grounded electrode, said third grounded electrode being disposed below said focus ring such that said focus ring is disposed between said second grounded electrode and said third grounded electrode, said second grounded electrode at least partially overlapping said focus ring and said third grounded electrode, wherein an impedance of said first grounded electrode is different from an impedance of said third grounded electrode.

2. The plasma processing chamber of claim 1, wherein said adjustable coupling to ground circuit includes at least a variable capacitor and said resistor, said variable capacitor being electrically coupled to said ground through said resistor.

3. The plasma processing chamber of claim 1, wherein said capacitor having a fixed capacitance.

4. The plasma processing chamber of claim 1, wherein a capacitance of said capacitor being less than 1000 pf.

5. The plasma processing chamber of claim 4, wherein said capacitance of said capacitor is 2 pf.

6. The plasma processing chamber of claim 1, wherein a resistance of said resistor is 3 micro Ohms.

7. The plasma processing chamber of claim 1, wherein an impedance of said first grounded electrode is different from an impedance of said second grounded electrode.

8. The plasma processing chamber of claim 1, wherein said impedance of said first grounded electrode is higher than an impedance of said second grounded electrode.

9. The plasma processing chamber of claim 1, wherein said powered electrode is coupled with only one single power supply.

10. The plasma processing chamber of claim 1, wherein said impedance of said first grounded electrode is higher than said impedance of said third grounded electrode.

11. The plasma processing chamber of claim 1 further comprising at most one power supply, said at most one power supplied coupled with said powered electrode.

12. The plasma processing chamber of claim 1 wherein said confinement ring extends above said second grounded electrode and extends below said second grounded electrode.

13. The plasma processing chamber of claim 1 wherein said first grounded electrode is grounded through said adjustable coupling to ground circuit.

14. The plasma processing chamber of claim 1 wherein said second grounded electrode is not grounded through any adjustable coupling to ground circuit.

15. The plasma processing chamber of claim 1 wherein a surface of said first grounded electrode faces a surface of said powered electrode, and an area of said surface of said first grounded electrode is less than an area of said surface of said powered electrode.

16. The plasma processing chamber of claim 1 wherein at least a portion of said second grounded electrode overlaps at least a portion of said powered electrode.

* * * * *